US009936600B2

(12) United States Patent
Kim et al.

(10) Patent No.: US 9,936,600 B2
(45) Date of Patent: Apr. 3, 2018

(54) MOTOR DRIVE UNIT

(71) Applicant: LSIS CO., LTD., Gyeonggi-do (KR)

(72) Inventors: Dong-Sik Kim, Gyeonggi-do (KR); Chun-Suk Yang, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/411,809

(22) Filed: Jan. 20, 2017

(65) Prior Publication Data

US 2017/0245387 A1 Aug. 24, 2017

(30) Foreign Application Priority Data

Feb. 24, 2016 (KR) ........................ 10-2016-0021750

(51) Int. Cl.
*H05K 7/20* (2006.01)
*H01L 23/473* (2006.01)
(Continued)

(52) U.S. Cl.
CPC ......... *H05K 7/1432* (2013.01); *H01L 23/473* (2013.01); *H02K 11/33* (2016.01); (Continued)

(58) Field of Classification Search
CPC . G06F 1/181–1/182; H05K 7/20218–7/20381; (Continued)

(56) References Cited

U.S. PATENT DOCUMENTS 5,257,180 A 10/1993 Sashida et al.
6,989,616 B2 1/2006 Okubo et al.
(Continued)

FOREIGN PATENT DOCUMENTS

DE 102012103217 B3 8/2013
JP H8-4260 B2 1/1996
(Continued)

OTHER PUBLICATIONS

European Search Reports dated Jun. 16, 2017 in connection with the counterpart European Patent Application No. 17153014.0.
(Continued)

*Primary Examiner* — Anthony Haughton
*Assistant Examiner* — Razmeen Gafur
(74) *Attorney, Agent, or Firm* — K&L Gates LLP

(57) ABSTRACT

Disclosed herein is a motor drive unit. The motor drive unit includes a base part; a middle base part disposed above the base part; a heat discharging part mounted on the base part and disposed under the middle base part to slide on the middle base part, wherein an area in which the heat discharging part is installed is smaller than an area of the middle base part; and a power PCB part disposed above the middle base part, an EMC PCB part disposed above the power PCB part with a spacing; a control PCB part coupled with a side portion of the power PCB part; and a condenser unit penetrating the middle base part to be fixed to it, wherein a lower end of the condenser unit is disposed on a side of the heat discharging part.

7 Claims, 10 Drawing Sheets

(51) Int. Cl.
  *H05K 7/14* (2006.01)
  *H02K 11/33* (2016.01)
  *H05K 5/00* (2006.01)

(52) U.S. Cl.
  CPC ............ *H05K 5/0017* (2013.01); *H05K 7/209* (2013.01); *H05K 7/20509* (2013.01)

(58) Field of Classification Search
  CPC ............ H05K 7/20409–7/20418; H05K 7/20009–7/202; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 2005/0219825 | A1* | 10/2005 | Campini | G06F 1/183 361/719 |
| 2007/0062673 | A1* | 3/2007 | Olesen | F28F 3/12 165/80.4 |
| 2007/0064396 | A1* | 3/2007 | Oman | H01L 23/427 361/700 |
| 2007/0165376 | A1* | 7/2007 | Bones | H01L 25/162 361/688 |
| 2007/0230127 | A1* | 10/2007 | Peugh | H01L 23/053 361/699 |
| 2008/0112132 | A1 | 5/2008 | Ehler | |
| 2008/0144290 | A1* | 6/2008 | Brandt | B60R 16/0239 361/720 |
| 2009/0231811 | A1* | 9/2009 | Tokuyama | H01L 23/36 361/699 |
| 2009/0268405 | A1 | 10/2009 | Kaveh | |
| 2009/0268406 | A1* | 10/2009 | Isomoto | H02M 7/003 361/697 |
| 2010/0039776 | A1* | 2/2010 | Nuki | H05K 7/209 361/710 |
| 2011/0222239 | A1* | 9/2011 | Dede | F28F 7/02 361/689 |
| 2011/0222244 | A1* | 9/2011 | Takashiro | H02M 7/003 361/704 |
| 2011/0299244 | A1* | 12/2011 | Dede | F28F 3/046 361/689 |
| 2012/0188712 | A1* | 7/2012 | Ishibashi | H02M 7/003 361/688 |
| 2013/0044434 | A1* | 2/2013 | Sharaf | H05K 7/20927 361/702 |
| 2013/0058044 | A1* | 3/2013 | Watanabe | H05K 5/006 361/714 |
| 2013/0077255 | A1* | 3/2013 | Abe | H01L 23/36 361/716 |
| 2013/0119908 | A1* | 5/2013 | Harada | H02P 6/10 318/400.42 |
| 2013/0258594 | A1* | 10/2013 | Gradinger | F28D 15/02 361/700 |
| 2014/0009890 | A1* | 1/2014 | Moon | H05K 7/20445 361/707 |
| 2014/0168900 | A1* | 6/2014 | Korich | H05K 7/1432 361/709 |
| 2014/0347817 | A1* | 11/2014 | Joshi | H05K 7/20927 361/699 |
| 2014/0355212 | A1* | 12/2014 | Campbell | H05K 7/20236 361/699 |
| 2015/0163962 | A1* | 6/2015 | Suzuki | H02M 7/003 361/699 |
| 2015/0296661 | A1* | 10/2015 | Mari Curbelo | H01L 23/427 361/700 |
| 2015/0334874 | A1* | 11/2015 | Rai | H05K 7/20254 361/699 |

FOREIGN PATENT DOCUMENTS

| | | |
|---|---|---|
| JP | 2002-16385 A | 1/2002 |
| JP | 2004023841 A | 1/2004 |
| JP | 4265558 B2 | 5/2009 |
| JP | 2010104146 A | 5/2010 |
| JP | 5116834 B2 | 1/2013 |
| JP | 2013070028 A | 4/2013 |
| JP | 2013074671 A | 4/2013 |
| JP | 2013103535 A | 5/2013 |
| JP | 2014-138442 A | 7/2014 |
| JP | 2014159795 A | 9/2014 |
| KR | 10-2004-0103001 A | 12/2004 |
| KR | 20-2011-0007764 | 8/2011 |
| KR | 10-1466032 B1 | 11/2014 |

OTHER PUBLICATIONS

Japanese Office Action for related Japanese Application No. 2017-009677; action dated Dec. 19, 2017; (5 pages).

Office Action dated Aug. 10, 2017 issued in corresponding Korean Application No. 10-2016-0021750.

* cited by examiner

PRIOR ART (US only)

PRIOR ART (US only)

PRIOR ART (US only)

MOTOR DRIVE UNIT

BACKGROUND

1. Technical Field

The present application claims priority to Korean Patent Application No. 10-2016-0021750 filed on Feb. 24, 2016 in the Republic of Korea, the disclosures of which are incorporated herein by reference.

The present disclosure relates to a motor drive unit. More specifically, the present disclosure relates to a motor drive unit in which circuit boards can be assembled more easily, and the circuit boards are shielded from foreign matter to improve quality reliability and durability of the circuit boards, with reduced size to save the cost.

2. Description of the Related Art

Typically, a motor drive unit refers to a series of apparatuses that receive power from the mains electricity to vary the voltage and frequency by itself and control the speed of a motor with high efficiency.

The demands for a motor drive unit are ever increasing as means for saving energy and improving the energy utilization efficiency.

Such an existing motor drive unit will be described below.

FIG. 1 is a perspective view of an existing motor drive unit. FIG. 2 is a perspective view of an existing power PCB assembly. FIG. 3 is a side view of an existing motor drive unit.

Referring to FIGS. 1 to 3, an existing motor drive unit includes a heat sink 1, a middle base part 2, and a plurality of PCB assemblies.

The heat sink 1 is installed on a base.

The middle base part 2 is disposed on the heat sink 1. The middle base part 2 is coupled with the heat sink 1 by hooks 6.

The area of the middle base part 2 is substantially equal to the area of the upper portion of the heat sink 1.

In the middle base part 2, the plurality of PCB assemblies is installed.

The plurality of PCB assemblies includes a power PCB assembly 3, a condenser PCB assembly, and a control PCB assembly.

On the upper portion of the middle base part 2, the power PCB assembly 3 is installed.

Although not shown in the drawings, the condenser PCB assembly and the control PCB assembly are disposed on the upper portion of the power PCB assembly 3.

The arrangement and effects of the above-described configuration will be described in detail below.

The middle base part 2 disposed on the heat sink 1 is coupled by a hook 7.

The middle base part 2 fastens and couples the plurality of PCB assemblies and isolates the heat sink 1 from the power PCB assembly 3.

The power PCB assembly 3 is coupled on the middle base part 2 by the hooks 6 and screws.

The heat sink 1 discharges heat generated in a module in the power PCB assembly 3.

The condenser PCB assembly is coupled with the power PCB assembly with screw holders 10 of the power PCB assembly and bosses 11 of the middle base unit 2 and coupled with the hooks 7 of the middle base part.

The screw holders 10 may fix the condenser PCB assembly and may allow a current to flow from the power PCB assembly 3 to condensers.

In the existing motor drive unit having the above-described configuration, the condensers 12 are mounted above the condenser PCB assembly.

In the existing motor drive unit having the configuration, the heat sink has the area equal to the area of the middle base part. Therefore, the size of the heat sink is determined based on the overall size of the product, not on the optimal size for discharging heat generated in a module, such that it is difficult to reduce the size of the apparatus.

In addition, the larger the size of the apparatus is, the larger the size of the heat sink is, and thus there is a problem in that the price of the apparatus is increased.

In addition, the condensers 12 disposed on the power PCB assembly 3 are mounted only on the upper side of the board, and thus the height of the apparatus is increased with the height of the condensers 12. Therefore, there is a limit on reducing the size of the product.

Moreover, in the existing motor drive unit, the hooks 6 in the middle base part are fastened to the heat sink 1, and thus durability is lowered and it can be easily broken by external force.

For example, Korean Patent Publication No. 10-2007-0053940 (published on May 28, 2007) discloses a flexible circuit board that prevents circuit interference between layers.

SUMMARY

It is an object of the present disclosure to provide a motor drive unit that reduces the size of a heat sink, and reduces the size of the apparatus by disposing condensers under a PCB such that they protrudes therefrom downwardly.

It is another object of the present disclosure to provide a motor drive unit that has an area in which a heat sink is installed smaller than the area of a middle base part, and improves heat discharging efficiency by disposing a plurality of PCB assemblies such that they surround some periphery of the heat sink and fixed thereto.

It is another object of the present disclosure to provide a motor drive unit that ensures durability by fixing a heat sink and condensers in different manners.

In accordance with one aspect of the present disclosure, a motor drive unit includes a base part; a middle base part disposed above the base part; a heat discharging part mounted on the base part and disposed under the middle base part to slide on the middle base part, wherein an area in which the heat discharging part is installed is smaller than an area of the middle base part; and a power PCB part disposed above the middle base part, an EMC PCB part disposed above the power PCB part with a spacing; a control PCB part coupled with a side portion of the power PCB part; and a condenser unit penetrating the middle base part to be fixed to it, wherein a lower end of the condenser unit is disposed on a side of the heat discharging part.

The middle base part may have one or more through hole parts formed therein, and the condenser unit may be inserted and fixed to the through hole parts.

The condenser unit may be inserted into the one or more through hole parts and fixed thereto upright.

The through hole parts may include a through hole into which the condenser unit is inserted, and a fixture extended from the through hole downwardly to closely surround a periphery of the condenser unit.

A pair of sliding grooves may be formed on either side of an upper portion of the heat discharging part, and a pair of sliding rails may be formed on either side of the middle base part, such that the pair of sliding rails may be inserted into the pair of the sliding grooves, respectively.

Fixing ribs may be formed in the middle base part, and the fixing ribs fix the power PCB part upwardly with a spacing.

Fixing projections may be formed on a side of the power PCB part, and fixing holes may be formed in the control PCB part. The fixing projections may be inserted into the fixing holes, respectively.

The control PCB part may be disposed upright with respect to the base part.

The power PCB part may have a conductive holder, and the conductive holder may fix the EMC PCB part and deliver a current input to the EMC PCB part to the power PCB part.

According to an exemplary embodiment of the present disclosure, the size of a heat sink can be reduced, and the size of the apparatus can be reduced by disposing condensers under a PCB such that they protrudes therefrom downwardly.

According to another exemplary embodiment of the present disclosure, an area in which a heat sink is installed is smaller than the area of a middle base part, and a plurality of PCB assemblies is disposed such that they surround some periphery of the heat sink and fixed thereto, thereby improving heat discharging efficiency.

According to an exemplary embodiment of the present disclosure, a motor drive unit can ensure durability by fixing a heat sink and condensers in different manners.

DETAILED DESCRIPTION

Hereinafter, a motor drive unit according to an exemplary embodiment of the present disclosure will be described with reference to the accompanying drawings.

Figure 1:
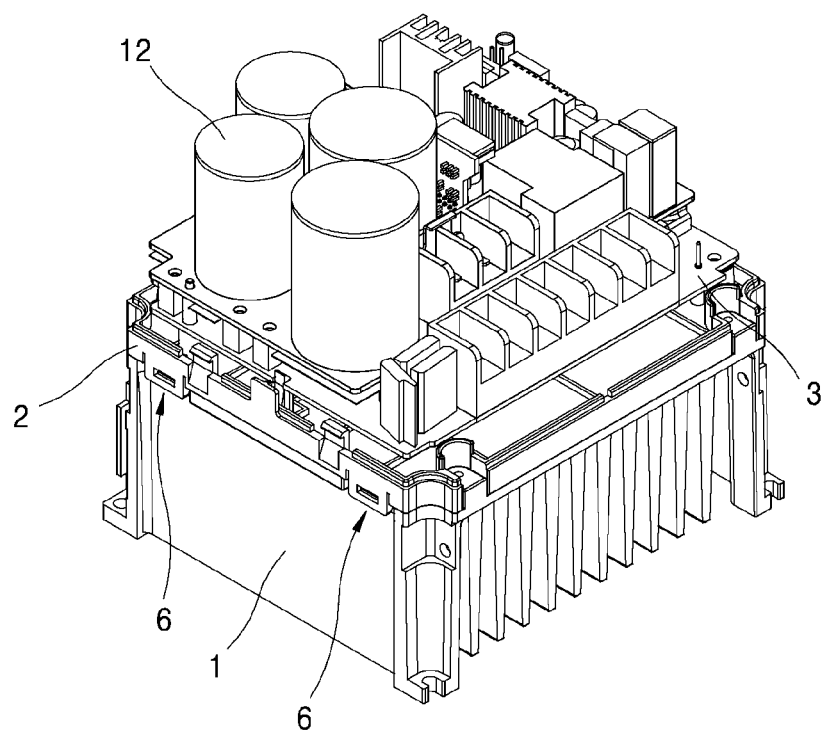
FIG. 1 is a perspective view of an existing motor drive unit.
Figure 2:
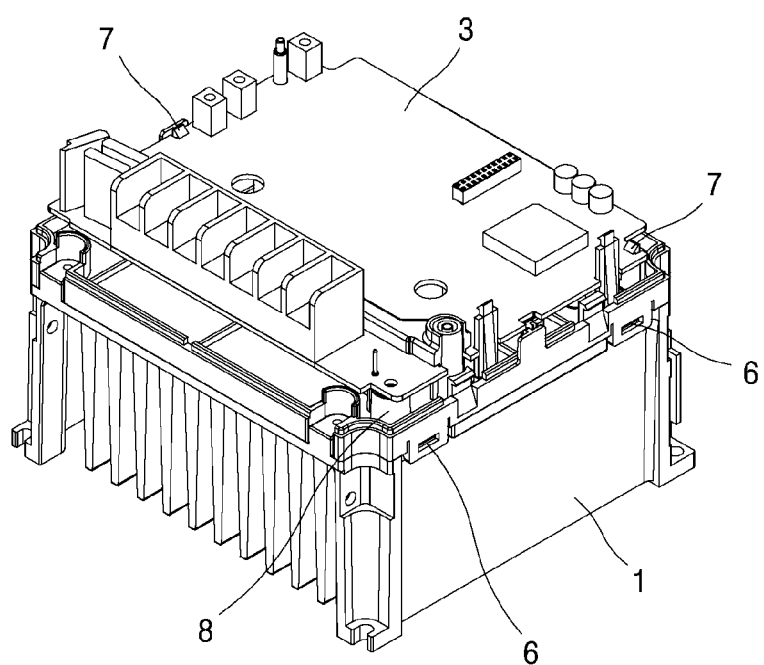
FIG. 2 is another perspective view of an existing motor drive unit.
Figure 3:
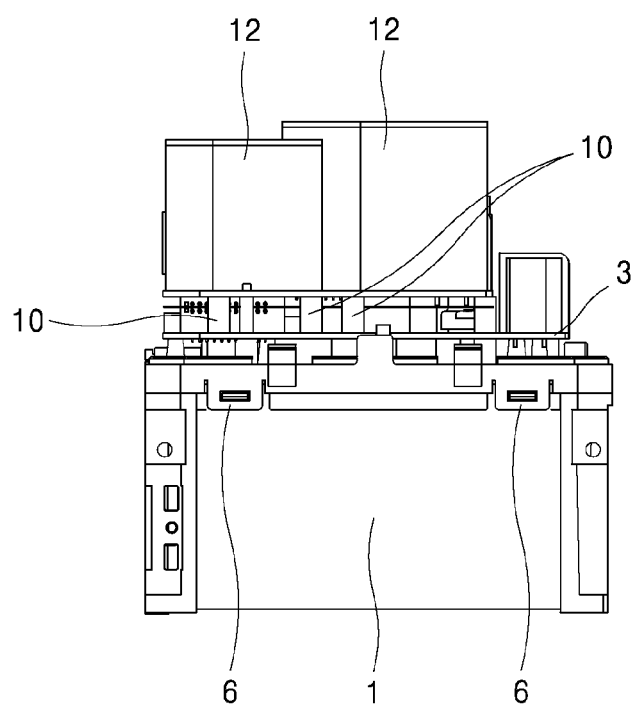
FIG. 3 is a side view of an existing motor drive unit.
Figure 4:
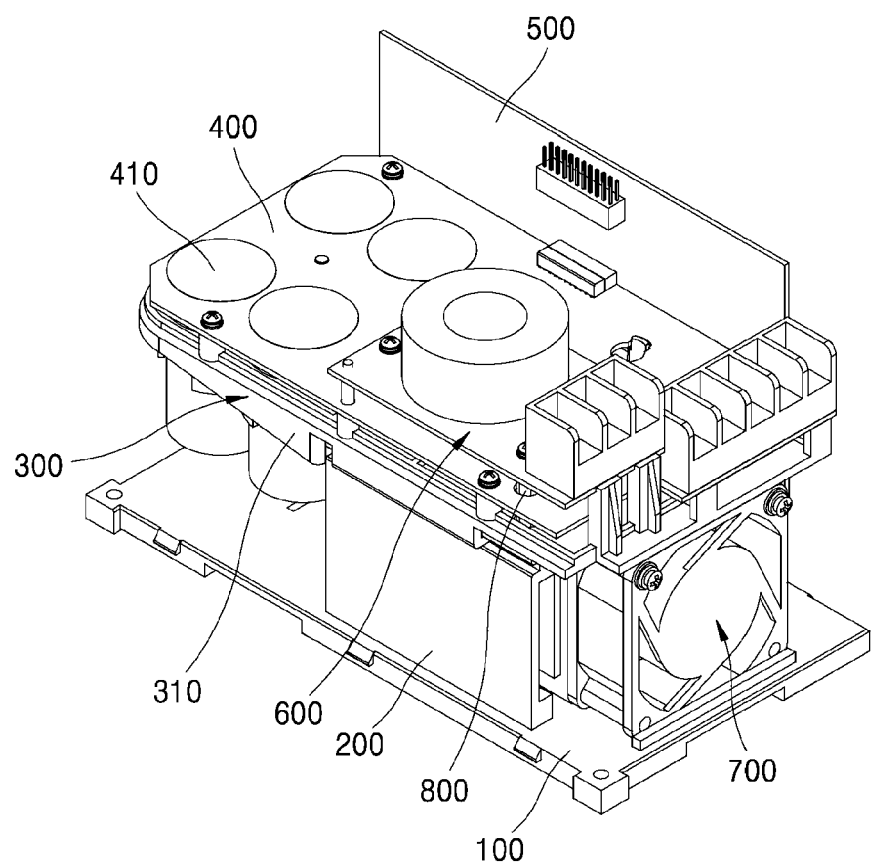
FIG. 4 is a perspective view of a motor drive unit according to an exemplary embodiment of the present disclosure.
Figure 5:
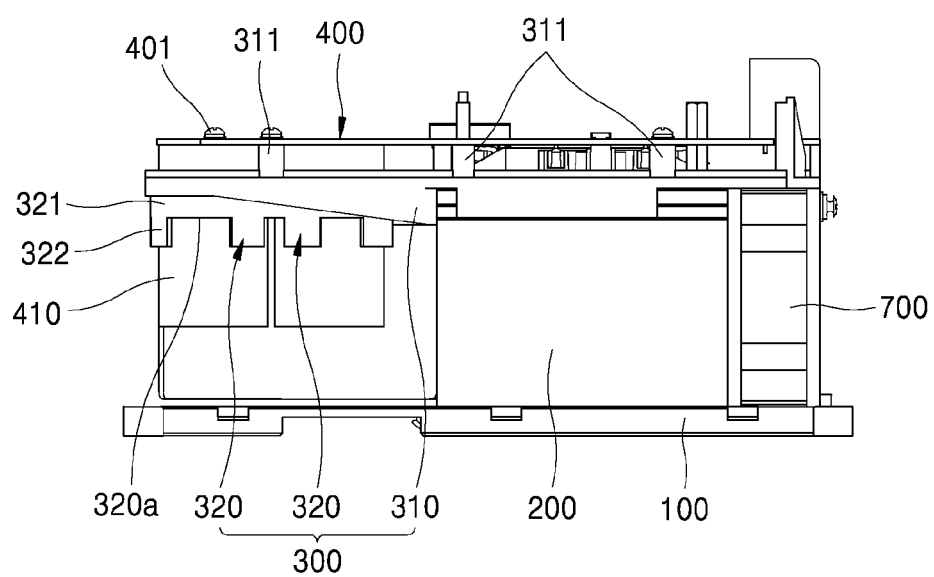
FIG. 5 is a side view of the motor drive unit according to the exemplary embodiment of the present disclosure.
Figure 6:
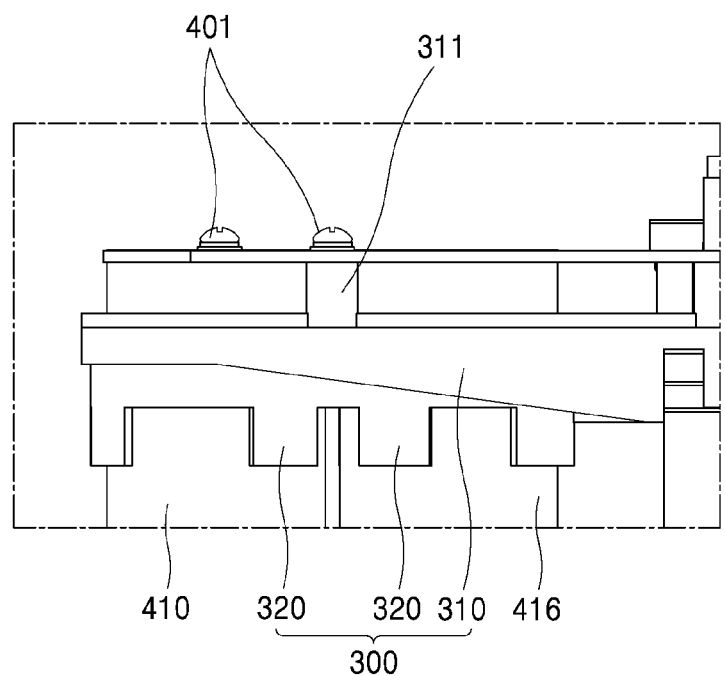
FIG. 6 is a view showing the coupling relationship between a condenser unit and a through hole.

FIG. 4 is a perspective view of a motor drive unit according to an exemplary embodiment of the present disclosure. FIG. 5 is a side view of the motor drive unit according to the exemplary embodiment of the present disclosure. FIG. 6 is a view showing the coupling relationship between a condenser unit and a through hole.

Referring to FIGS. 4 and 5, the motor drive unit according to the exemplary embodiment of the present disclosure includes a base part 100, a middle base part 300, a heat-discharging part 200, a power PCB part 400, an EMC PCB part 600, a control PCB part 500, and a condenser unit 410.

The arrangement of the elements will be described and then the coupling relationship among them will be described.

The middle base part 300 having a predetermined area is disposed on the base part 100.

The heat-discharging part 200 is disposed between the middle base part 300 and the base part 100. The heat-discharging part 200 is a heat sink.

The area in which the heat-discharging part 200 is installed is preferably smaller than the area of the middle base part 300.

On the contrary, the area in which the heat-discharging part 200 is installed may be included in the area of the middle base part 300.

The power PCB part 400 is disposed on the middle base part 300.

In addition, the EMC PCB part 600 is disposed above the power PCB part 400 and spaced apart from it by a predetermined distance.

The control PCB part 500 is disposed upright and is fixed to a side portion of the power PCB part 400.

The lower end of the control PCB part 500 may surround the side portions of the heat-discharging part 200.

The condenser unit 410 penetrates and is fixed to the middle base part 300, such that the lower portion is located on the side of the heat-discharging part 200.

The coupling relationship among the above-described elements will be described.

Figure 7:
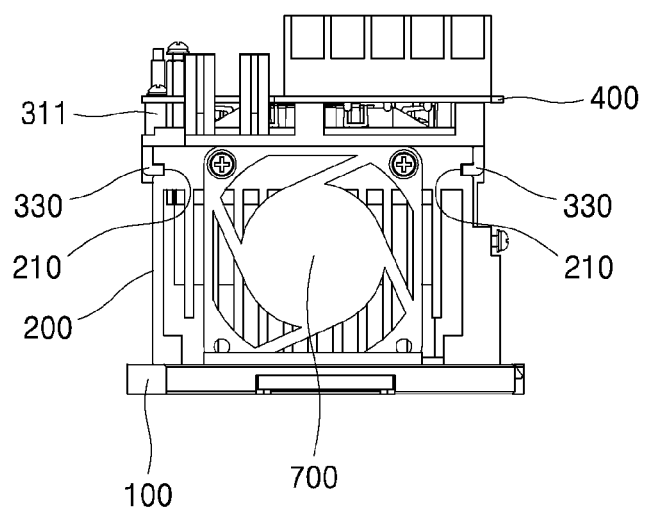
FIG. 7 is another side view of the motor drive unit according to the exemplary embodiment of the present disclosure.

FIG. 7 is another side view of the motor drive unit according to the exemplary embodiment of the present disclosure.

Referring to FIGS. 5 and 7, the heat-discharging part 200 is coupled with the middle base part 300 such that it slides thereon.

On the either side of the upper portion of the heat-discharging part 200, a pair of sliding grooves 210 is formed, respectively.

In addition, on the either side of the middle base part 300, a pair of sliding rails 330 is disposed, respectively.

The pair of sliding grooves 210 is coupled with the pair of sliding rails 330, respectively.

Accordingly, the heat-discharging part 200 is coupled on the side of the middle base part 300 such that it slides thereon.

Preferably, the lower end of the heat-discharging part 200 is mounted on the base part 100.

In addition, a fan for discharging heat 700 is installed on the side portion of the heat-discharging part 200.

Referring to FIGS. 5 and 6, a condenser unit 410 is located on the side of the heat-discharging part 200.

The condenser unit 410 includes condensers having the same shape, e.g., a cylinder shape.

In the middle base part 300, a through hole part 320 are formed by penetrating it, via which the condenser unit is fixed.

The through hole part 320 includes through holes 321 into which the condenser unit 410 is inserted, and fixtures 322 extended from the through holes 321 downward to closely surround the periphery of the condenser unit 410.

The fixtures 322 have a cylindrical shape.

A plurality of cut-out grooves 320a is formed along the fixtures 322 upwardly such that they have a U-shape. This can mitigate impact.

Accordingly, the condenser unit 410 is fixed upright by the through holes 320 formed in the middle base part 300, and the lower end is disposed adjacent to the heat discharging part.

According to the exemplary embodiment of the present disclosure, the power PCB part 400 is disposed above the middle base part 300 and spaced apart from it upwardly.

In the middle base part 300, a plurality of fixing ribs 311 extended upwardly is formed.

The fixing ribs 311 penetrate the power PCB part 400 and the upper end is fastened by screw bolts 401.

The plurality of fixing ribs 311 fixes the power PCB part 400 at several positions, such that the power PCB part 400 is spaced apart from the upper end of the middle base part 100 by the length of the fixing ribs 311.

Figure 8:
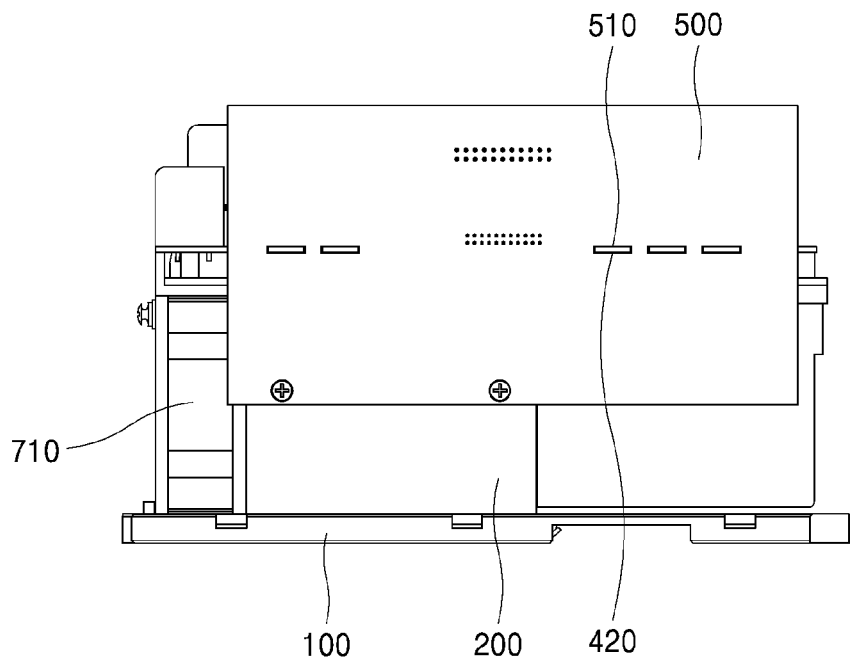
FIG. 8 is a view showing installation of a control PCB part according to an exemplary embodiment of the present disclosure.
Figure 9:
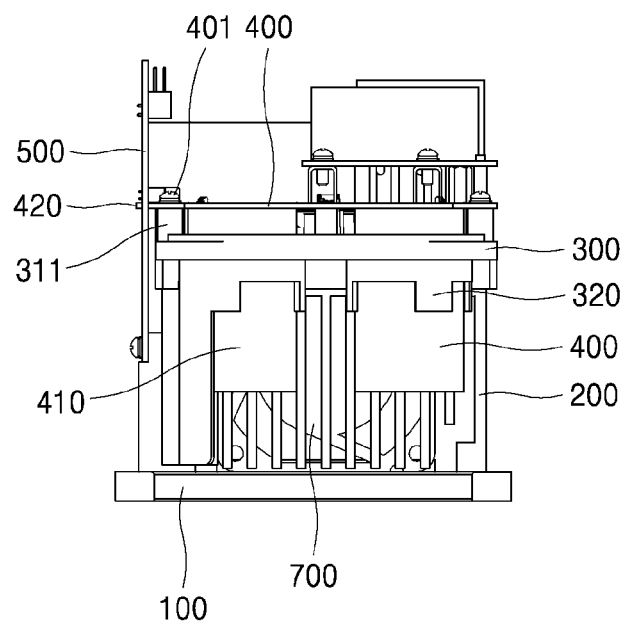
FIG. 9 is another side view showing installation of a control PCB part according to an exemplary embodiment of the present disclosure.

FIG. 8 is a view showing the installation of a control PCB part according to an exemplary embodiment of the present disclosure. FIG. 9 is another side view showing installation of a control PCB part according to an exemplary embodiment of the present disclosure.

Referring to FIGS. 8 and 9, the control PCB part 500 is disposed upright on the side portion of the power PCB part 400.

On the side portion of the power PCB part 400, a plurality of fixing projections 420 is formed, which protrudes outwardly.

Preferably, the fixing projections 420 may have a quadrangular shape.

In addition, in the control PCB part 500, a plurality of fixing holes 510 is formed, in which the plurality of fixing projections 420 is inserted, respectively.

Accordingly, the plurality of fixing projections 420 is inserted into the plurality of fixing holes 510, respectively, such that the control PCB part 500 is connected to the side portion of the power PCB part 400 and remains upright.

The lower end of the control PCB part 500 is located on the side of the heat-discharging part 200, such that heat discharging is facilitated as it is adjacent to the heat-discharging part 200.

Figure 10:
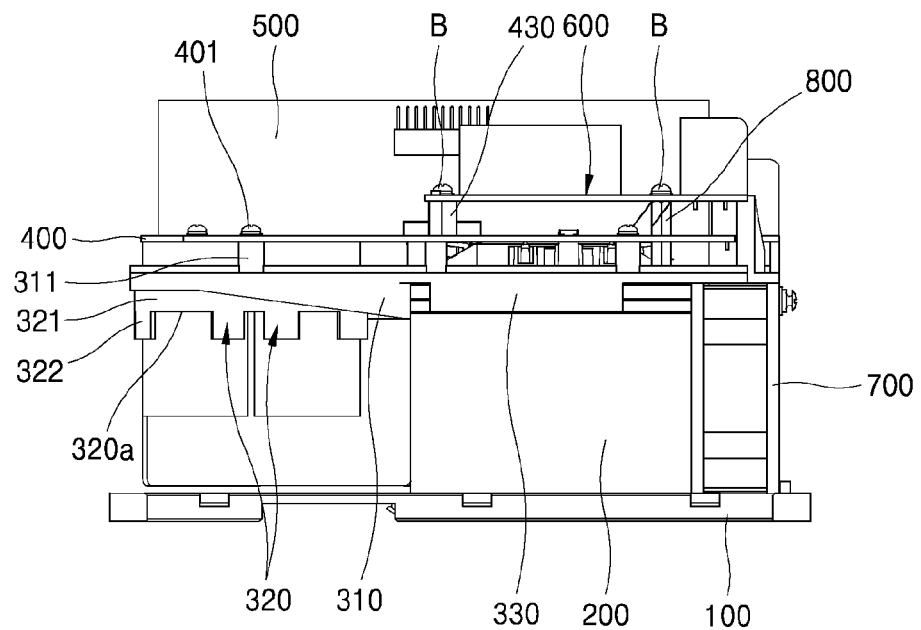
FIG. 10 is a view showing installation of a EMC PCB part according to an exemplary embodiment of the present disclosure.

FIG. 10 is a view showing installation of an EMC PCB part according to an exemplary embodiment of the present disclosure.

Referring to FIG. 10, the EMC PCB part 600 according to an exemplary embodiment of the present disclosure is disposed above the power PCB part 400.

In addition, as the EMC PCB part 600 is disposed above the power PCB part 400 and spaced apart from it, it is easily exposed to the air to thereby increase the efficiency of discharging heat.

Conductive screw holders 430 are installed in the power PCB part 400.

The conductive screw holders 430 fix the EMC PCB part 600 such that it is spaced apart from the power PCB part 400 and delivers electric signal to the power PCB part 400.

In addition, according to an exemplary embodiment of the present disclosure, a brass supporter 800 may be further included.

In addition to the function of fixing the EMC PCB part 600, the brass supporter 800 may also form an earth terminal box with the heat-discharging part 200, thereby performing earth function.

With the above-described configuration and effects, according to an exemplary embodiment of the present disclosure, the size of a heat sink can be reduced, and the size of the apparatus can be reduced by disposing condensers such that they protrudes from the PCB downwardly.

According to another exemplary embodiment of the present disclosure, an area in which a heat sink is installed is smaller than the area of a middle base part, and a plurality of PCB assemblies is disposed such that they surround some periphery of the heat sink and fixed thereto, thereby improving heat discharging efficiency.

According to an exemplary embodiment of the present disclosure, a motor drive unit can ensure durability by fixing a heat sink and condensers in different manners.

While the present disclosure has been described in connection with the exemplary embodiments thereof, it is to be appreciated that various modifications and variations can be made without departing from the scope of the present disclosure.

Accordingly, the scope of the present disclosure is not construed as being limited to the above-described embodiments but is defined by the appended claims as well as equivalents thereto.

Therefore, it should be understood that the above-mentioned embodiments are not restrictive but are illustrative in all aspects. It should be understood that the drawings and the detailed description are not intended to limit the present disclosure to the particular forms disclosed herein, but on the contrary, the intention is to cover all modifications, equivalents, and alternatives falling within the spirit and scope of the present disclosure as defined by the appended claims.

What is claimed is:

1. A motor drive unit comprising:
   a base part;
   a middle base part disposed above the base part;
   a heat discharging part disposed between the base part and the middle base part, wherein an area in which the heat discharging part is installed is smaller than an area of a bottom of the middle base part;
   a condenser unit disposed on a side of the heat discharging part and fixed to the middle base part;
   a power PCB part disposed above the middle base part;
   an EMC PCB part disposed above the power PCB part and spaced apart therefrom; and
   a control PCB part coupled with a side portion of the power PCB part,
   wherein an upper end of the heat discharging part is disposed under the middle base part to be coupled with the middle base part, and the area in which the heat discharging part is installed is smaller than an area of a top surface of the base part.

2. The motor drive unit of claim 1, wherein the middle base part has one or more through hole parts formed therein, wherein the condenser unit is inserted and fixed to the through hole parts, and the condenser unit is inserted into the one or more through hole parts and fixed thereto upright.

3. The motor drive unit of claim 2, wherein the through hole parts comprise a through hole into which the condenser unit is inserted, and a fixture extended from the through hole downwardly to closely surround a periphery of the condenser unit.

4. The motor drive unit of claim 1, wherein a pair of sliding grooves is formed on either side of an upper portion of the heat discharging part, and a pair of sliding rails is formed on either side of the middle base part, wherein the pair of sliding rails is inserted into the pair of the sliding grooves, respectively.

5. The motor drive unit of claim 1, wherein fixing ribs are formed in the middle base part, wherein the fixing ribs fix the power PCB part upwardly with a spacing such that the power PCB part is spaced apart from an upper end of the middle base part.

6. The motor drive unit of claim 1, wherein fixing projections are formed on a side of the power PCB part, and fixing holes are formed in the control PCB part, wherein the fixing projections are inserted into the fixing holes, respectively, and wherein the control PCB part is disposed upright with respect to the base part.

7. The motor drive unit of claim 1, wherein the power PCB part has a conductive holder, wherein the conductive holder fixes the EMC PCB part and delivers a current input to the EMC PCB part to the power PCB part.

\* \* \* \* \*